United States Patent
Domaleski et al.

(10) Patent No.: US 9,450,535 B2
(45) Date of Patent: Sep. 20, 2016

(54) SOLAR POWERED SATELLITE SYSTEM

(71) Applicant: ECHOSTAR TECHNOLOGIES L.L.C., Englewood, CO (US)

(72) Inventors: Robert Domaleski, Franklin Lakes, NJ (US); Paul Anthony Langer, Westminster, CO (US); Harold Jaramillo, Castle Rock, CO (US); William Roberts, Centennial, CO (US)

(73) Assignee: EchoStar Technologies L.L.C., Englewood, CO (US)

(*) Notice: Subject to any disclaimer, the term of this patent is extended or adjusted under 35 U.S.C. 154(b) by 0 days.

(21) Appl. No.: 14/587,303

(22) Filed: Dec. 31, 2014

(65) Prior Publication Data
US 2016/0190978 A1 Jun. 30, 2016

(51) Int. Cl.
*H02N 6/00* (2006.01)
*H01L 31/042* (2014.01)
*H02S 20/30* (2014.01)
*H02S 30/10* (2014.01)
*H02S 40/36* (2014.01)

(52) U.S. Cl.
CPC .............. *H02S 20/30* (2014.12); *H02S 30/10* (2014.12); *H02S 40/36* (2014.12)

(58) Field of Classification Search
CPC ........ H02S 20/30; H02S 20/32; H02S 30/10; F24J 2/38; F24J 2/54; F24J 2/5417; F24J 2/5431; F24J 2002/385
See application file for complete search history.

(56) References Cited

U.S. PATENT DOCUMENTS

| | | | | |
|---|---|---|---|---|
| 4,582,953 A | * | 4/1986 | Nagase | F24J 2/0455 136/251 |
| 7,469,541 B1 | * | 12/2008 | Melton | F03D 9/007 60/641.1 |
| 2003/0000564 A1 | * | 1/2003 | Shingleton | F24J 2/085 136/244 |
| 2005/0284467 A1 | * | 12/2005 | Patterson | F24J 2/38 126/580 |
| 2009/0133737 A1 | * | 5/2009 | Anzawa | F24J 2/5235 136/246 |
| 2009/0188488 A1 | * | 7/2009 | Kraft | F24J 2/38 126/601 |
| 2010/0282315 A1 | * | 11/2010 | Gilbert | F24J 2/07 136/259 |
| 2013/0174889 A1 | * | 7/2013 | Dalland | H01L 31/045 136/245 |
| 2013/0312814 A1 | * | 11/2013 | Yamashita | H01L 31/0424 136/251 |
| 2014/0318597 A1 | * | 10/2014 | Khan | G05F 1/67 136/246 |

* cited by examiner

*Primary Examiner* — Eli Mekhlin
(74) *Attorney, Agent, or Firm* — LK Global

(57) ABSTRACT

A solar powered satellite system is provided. A power control system, for example, of the solar powered satellite system may include, but is not limited to, a first interface configured to receive a power signal from the satellite receiver, a voltage converter electrically coupled to the first interface, the voltage converter configured to reduce a voltage of the power signal received from the satellite receiver to a predetermined voltage, a second interface configured to receive a power signal from the solar panel assembly, a third interface configured to be coupled to at least one power consumer of a satellite dish, and a source selection circuit electrically coupled to the voltage converter, the solar panel assembly and the third interface, the source selection circuit configured to output a selected power signal based upon a comparison between the predetermined voltage and a voltage of the power signal from the solar panel assembly.

19 Claims, 16 Drawing Sheets

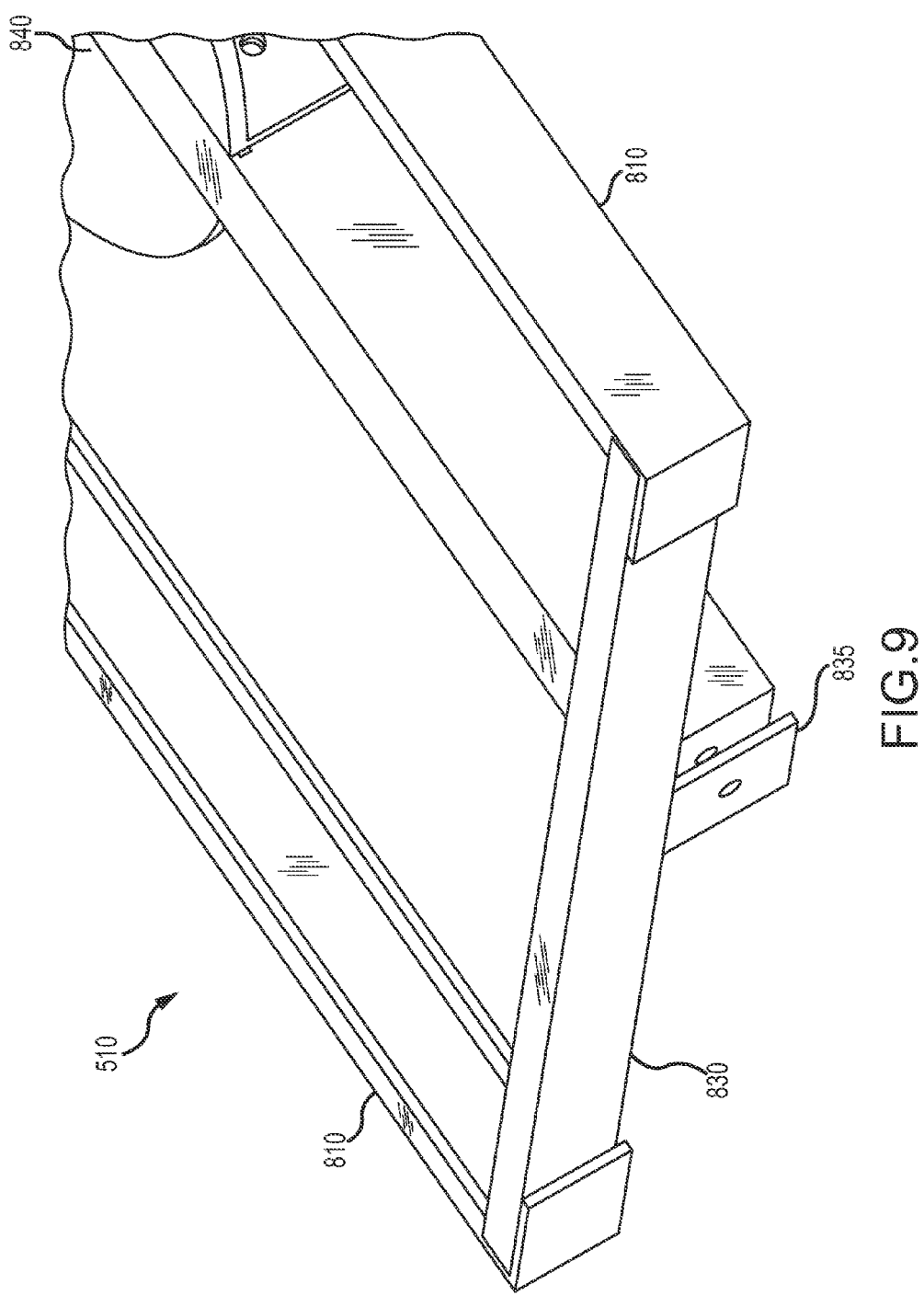

SOLAR POWERED SATELLITE SYSTEM

TECHNICAL FIELD

The following relates to satellite dishes, and more particularly to powering components of satellite dishes.

BACKGROUND

Satellite dishes are commonly used to receive broadcast television and to receive other communication signals, such as radio, internet, telephone and the like. Typically satellite dishes are mounted on the exterior of buildings. Many current satellite dishes include low-noise block down converter feedhorns, which require power to operate. However, getting power to the low-noise block down converter feedhorn can be cumbersome.

SUMMARY

In accordance with one embodiment, a solar panel installation system is provided. The solar panel installation system may include, but is not limited to a frame configured to secure at least one solar panel, an azimuth/elevation adjusting device coupled to the frame for adjusting an azimuth and elevation of the frame, a mast securably connected to the azimuth/elevation adjusting device, and a mounting connector securably connected to the mast, the mounting connector configured to be connected to an installation location.

In accordance with another embodiment, a solar panel installation system is provided. The solar panel installation system may include, but is not limited to a frame configured to secure at least one solar panel, an azimuth/elevation adjusting device coupled to the frame for adjusting an azimuth and elevation of the frame, the azimuth/elevation adjusting device including, but not limited to a solar panel interface, the solar panel interface configured to securably connect the azimuth/elevation adjusting device to the frame, a mast mount interface, the mast mount interface configured to securably connect the azimuth/elevation adjusting device to the mast, and a securable pivot for adjusting the elevation of the frame, the securable pivot including, but not limited to a channel, an axis configured to be movable within the channel, and at least one securing device to lock the axis into a position within the channel to set the elevation of the frame, the solar panel installation system further including a mast securably connected to the azimuth/elevation adjusting device.

In accordance with another embodiment, an apparatus is provided. The apparatus may include, but is not limited to, a solar panel, a frame receiving the solar panel, and a mast mechanically coupled to the frame.

DESCRIPTION OF THE DRAWING FIGURES

Exemplary embodiments will hereinafter be described in conjunction with the following drawing figures, wherein like numerals denote like elements.

FIGS. 8-9 are perspective views of another frame, in accordance with an embodiment;

DETAILED DESCRIPTION

According to various exemplary embodiments, a solar powered satellite system and a method for controlling the same are provided. The solar powered satellite system includes a solar powered installation system and a power control system for providing a low cost, low maintenance power source for power consumers of a satellite dish.

Figure 1:
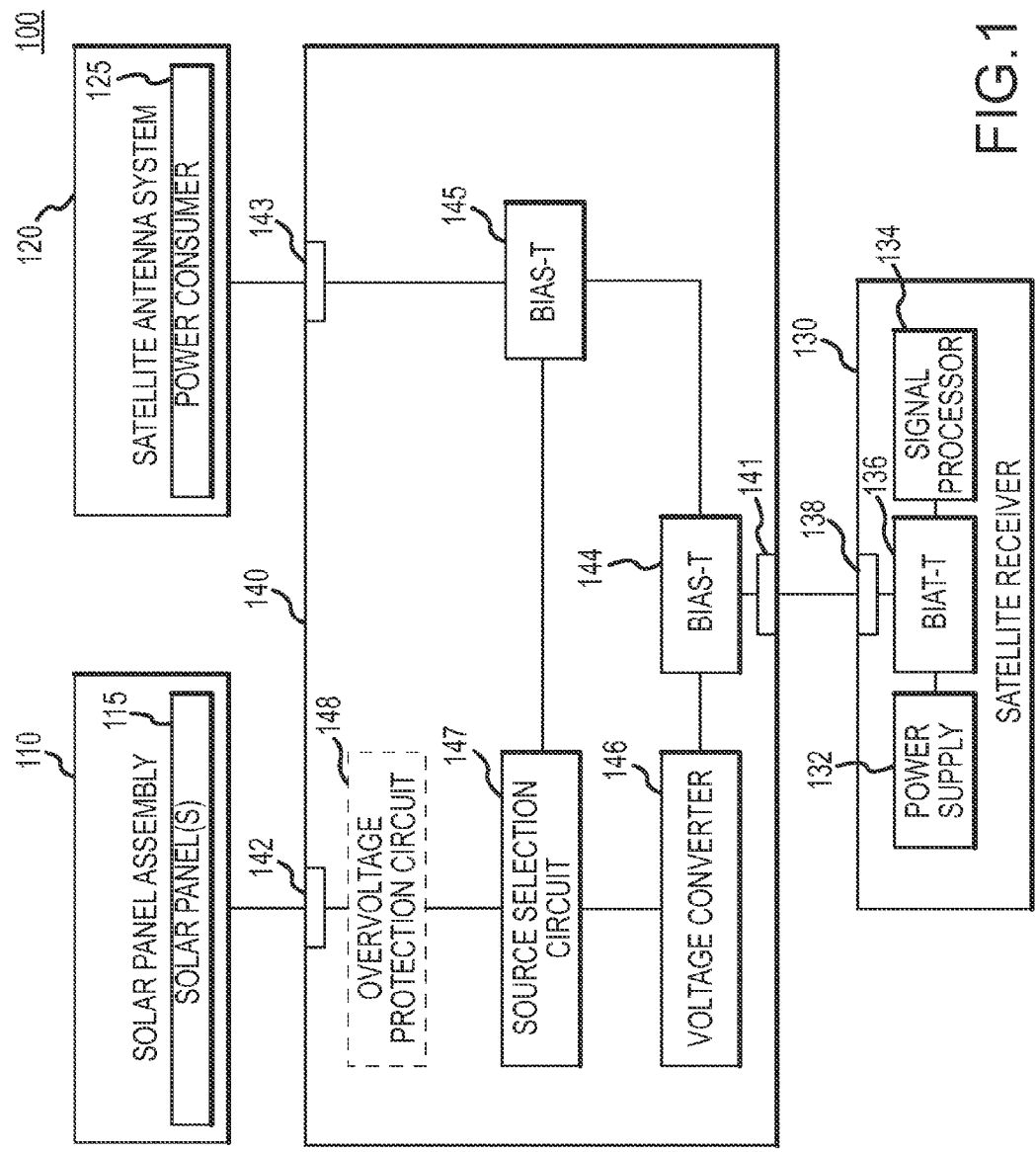
FIG. 1 is a block diagram of a solar powered satellite system, in accordance with an embodiment.

FIG. 1 is a block diagram of a solar powered satellite system 100, in accordance with an embodiment. The solar powered satellite system 100 includes a solar panel assembly 110. The solar panel assembly includes one or more solar panel(s) 115. The solar panel(s) 115 may be, for example, a photovoltaic module, a solar thermal energy panel, or any combination thereof.

The solar powered satellite system 100 includes at least one satellite antenna system 120 and at least one satellite receiver 130. The satellite antenna system 120 receives data via electromagnetic signals from satellites. The data may be, for example, broadcast television data, data for an internet connection, or the like. The satellite antenna system 120 includes, or is coupled to, at least one power consumer 125. The power consumer 125 may be, for example, a low-noise block down converter (LNB), a low-noise block down converter feedhorn (LNBF), associated control circuitry for signal selection, satellite switches, or the like. LNBF's, for example, are a combination of a low-noise block down converter (LNB) and a feedhorn. A feedhorn is a device which gathers radio waves transmitted from a satellite and transmits the received signals to the LNB. The LNB is the receiving device mounted on the satellite antenna system 120 which initially processes the radio waves. Typical LNBs include a low-noise amplifier to amplify the radio signal received from the satellite. The LNB may also include a control electronics (e.g., a microprocessor and/or other control logic devices), radio frequency (RF) switches, frequency mixer(s), local oscillator(s) and intermediate frequency (IF) amplifier(s) used to down convert a block of frequencies received from the satellite (e.g., in the microwave frequency range) to a lower frequency range, allowing the signal to be carried to an receiver via traditional (RG-6, RG-59, or similar) coaxial cable, or the like.

The power consumer(s) 125, as the name suggests, requires power to operate. When the power consumer 125 is an LNBF, for example, the low-noise amplifier, frequency mixer, local oscillator, IF amplifier, RF switches, and control electronics of the LNBF all require power to operate. As discussed in further detail below, power is provided to the power consumer 125 from the solar panel assembly 110, from the satellite receiver 130 or a combination of the solar panel assembly 110 and the satellite receiver 130.

The satellite receiver 130 may be, for example, a set-top box, a satellite modem, or the like. In general, the satellite receiver 130 includes a power supply 132, one or more signal processors 134, a bias-T 136, and an interface 138. The power supply 132 outputs a voltage used to power the power consumers(s) 125 of the satellite antenna system 120, as discussed in further detail below. Each signal processor 134 may be a central processing unit (CPU), a graphics processing unit (GPU), an application specific integrated circuit (ASIC), a microcontroller, a field programmable gate array (FPGA), or any other logic circuit or combination thereof. The signal processor(s) 134 may be, for example, a tuner which extracts audio and video signals from the signal received by the satellite antenna system 120. The extracted audio and video signals can be transformed for display on a television or use on other consumer electronic devices. The signal processor(s) 134 may also be a satellite modem which can be used to establish data transfers to and from a server, or the like, via the satellite antenna system 120. A satellite modem's main function is to transform a bit-stream into a radio signal so that data can be transmitted from the satellite antenna system 120 and to transform a radio signal received by the satellite antenna system 120 into a bit-stream such that a consumer electronic (e.g., computer, streaming media device, etc.) can utilize the received data.

In general, the signal processor(s) 134 receive radio frequency signals from the satellite antenna system 120 and transmit command signals to the satellite antenna system 120. The command signals can be, for example power commands, positioning commands, channel selection commands, sensor monitoring, or the like. The commands may be transmitted via the same connection as the RF signals such as voltage level switching, DiSEqC 22 kHz signaling, or FSK signaling.

The satellite receiver 130 utilizes the bias-T 136 and the interface 138 to transmit the command signals of the satellite antenna system 120, provide power to power consumer 125 of the satellite antenna system 120 and to receive radio signals from the satellite antenna system 120 along a single bus. In general, a bias-T 136 is a passive device that implements frequency domain multiplexing. In other words, the bias-T 136 can add multiple different signals to a single bus such that the signals can coexist on the single bus without interfering with one another. In one embodiment, for example, the power being provided to the power consumer 125 may be added as a voltage bias to the command signals being transmitted to the satellite antenna system 120.

In one embodiment, for example, the bias-T 136 may add and remove signals to a coaxial cable style bus. In this embodiment, for example, the interface 138 is a coaxial cable style interface. However, one of ordinary skill in the art would recognize that other types of buses and corresponding interfaces could be used.

The solar powered satellite system 100 further includes a power control system 140. The power control system 140 receives power from both the solar panel assembly 110 and the satellite receiver 130 and selects which one, or both, of the respective systems are used to provide power to the power consumer 125 of the satellite antenna system 120, as discussed in further detail below.

The power control system 140 is coupled between the solar panel assembly 110, the satellite antenna system 120 and the satellite receiver 130 via interfaces 141-143. In one embodiment, for example, each interface may be a coaxial cable interface. However, a hybrid optical fiber and electrical conductor interface, an Ethernet interface, a USB interface, or the like, could also be used. However, one or ordinary skill in the art would recognize that a wide variety of interfaces could be used. Furthermore, each of the interfaces 141-143 could be of the same type, or the interfaces 141-143 could vary.

The power control system 140 further includes a bias-T 144. The bias-T 144 is coupled to an interface 141 which is configured to be coupled to an interface 138 of the satellite receiver 130. As discussed above, the satellite receiver 130 transmits power, control, and RF signals through the interface 138 of the satellite receiver 130. The bias-T 144 splits the power from the control and RF signals, placing the power on a different bus. The control and RF signals are transmitted to another bias-T 145, as discussed in further detail below.

The power received from the satellite receiver 130 is transmitted to a voltage converter 146. The voltage converter 146 alters a voltage of the power received from the satellite receiver to a predetermined voltage, as discussed in further detail below.

Figure 2:
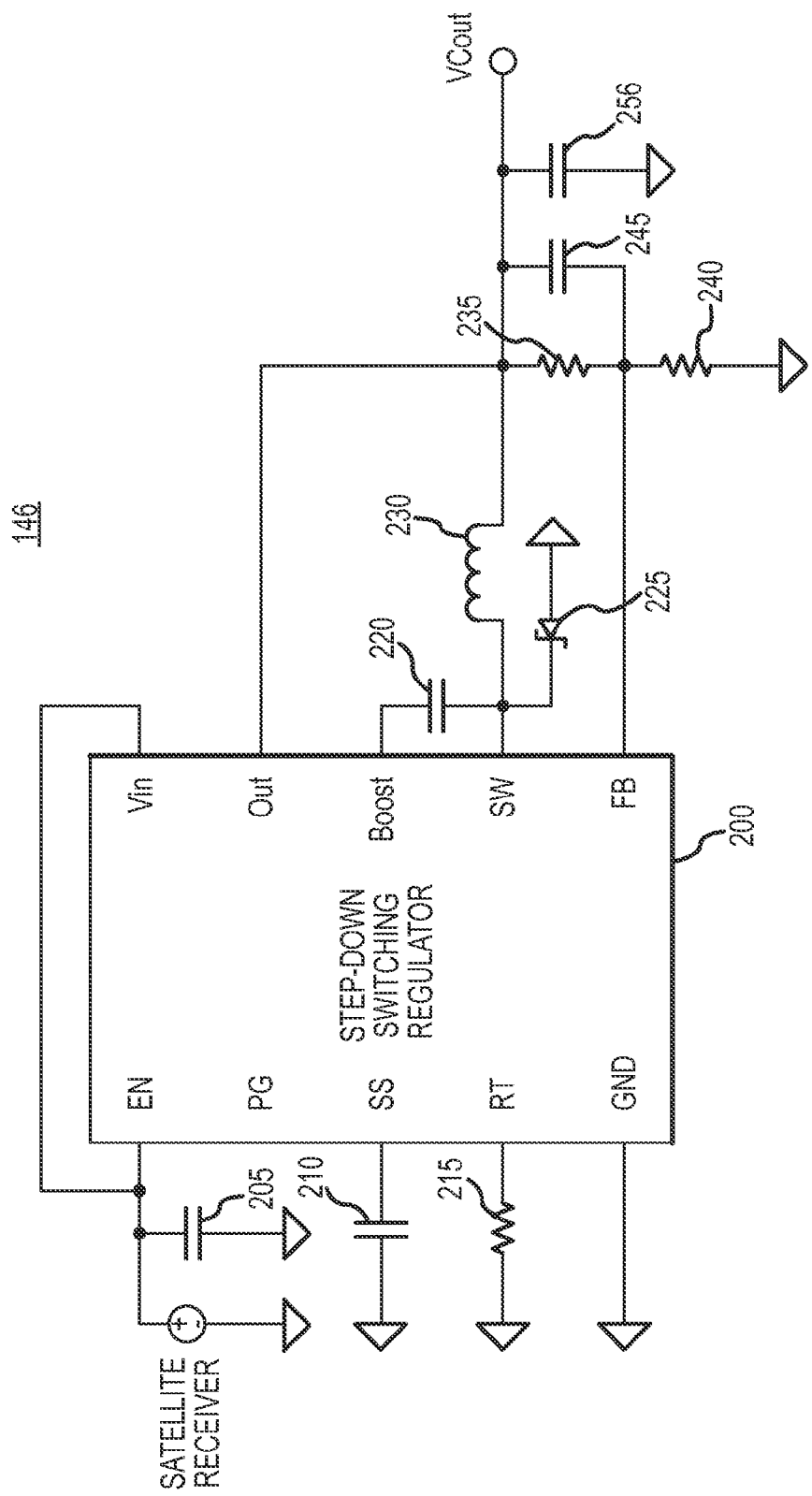
FIG. 2 illustrates an exemplary voltage converter, in accordance with an embodiment.

FIG. 2 illustrates an exemplary voltage converter 146, in accordance with an embodiment. In the embodiment illustrated in FIG. 2, the voltage converter 146 is a DC to DC buck switched mode power supply capable of reducing a voltage received from the satellite receiver 130. However, the voltage converter 146 could also be a buck-boost and boost mode switched mode power supply capable of increasing a voltage received from the satellite receiver 130. The type of voltage converter 146 used may depend upon the voltage output by the satellite receiver 130.

The voltage converter 146 illustrated in FIG. 2 includes a step-down switching regulator 200. The step-down switching regulator 200 functions as both the switch and the controller for opening and closing the switch in the DC to DC buck switched mode power supply illustrated in FIG. 2.

The power received from the satellite receiver 130, represented in FIG. 2 as a DC source, is connected to pin EN, an enable pin, and Vin of the step-down switching regulator 200. A capacitor 205 is coupled between the EN pin and ground to filter the input voltage. In one embodiment, for example, the capacitor 205 may be a 10 µF capacitor, however the capacitance can vary. A capacitor 210 is coupled between the SS pin, a soft start pin, and ground. In one embodiment, for example, the capacitor 210 may be a 0.002 µF capacitor, however the capacitance can vary. A resistor 215 is coupled between the RT pin, a timing resistor pin, of the step-down switching regulator 200 and ground for setting the switching frequency. In one embodiment, for example, the resistor 215 may be a 54.9 KΩ resistor, however the resistance can vary depending upon the desired switching frequency.

A capacitor 220 is coupled between the Boost pin of the step-down switching regulator 200 and the SW pin. In one embodiment, for example, the capacitor 220 may be a 0.47 µF capacitor, however the capacitance can vary. A diode 225 is coupled between the SW pin and ground. An inductor 230 is coupled between the SW pin and the output pin of the step-down switching regulator 200. In one embodiment, for example, the inductor 230 may be a 10 µH inductor, however the inductance can vary. A resistor 235 is coupled between the inductor 230 and a FB pin, a feedback pin, of the step-down switching regulator 200. In one embodiment, for example, the resistor 235 may be a 1 MΩ resistor, however the resistance can vary. A resistor 240 is coupled between the FB pin of the step-down switching regulator 200 and ground. In one embodiment, for example, the resistor 240 may be a 105 KΩ resistor, however the resistance can vary. A capacitor 245 is coupled between the inductor 230 and the FB pin of the step-down switching regulator 200. In one embodiment, for example, the capacitor 245 may be a 10 pF capacitor, however the capacitance can vary. A capacitor 250 is also coupled between inductor 230 and ground. In one embodiment, for example, the capacitor 250 may be a 47 µF capacitor, however the capacitance can vary. The output VCout of the voltage converter 146 is also coupled to the inductor 230, as seen in FIG. 2. The components 220-250 set the desired operation of the regulator such as output voltage, voltage accuracy, and monitor of fault conditions such as over current.

Returning to FIG. 1, the power control system 140 further includes a source selection circuit 147. The source selection circuit 147 determines power source for the power consumer 125 of the satellite antenna system 120. The power source can be the solar panel assembly 110, the satellite receiver 130, or a combination of both the solar panel assembly 110 and the satellite receiver 130. The source selection circuit 147 determines the power source for the power consumer 125 of the satellite antenna system 120 based upon the voltage output from the solar panel assembly 110 and the voltage output from the voltage converter 146.

In one embodiment, for example, the source selection circuit 147 may choose the source having the greatest voltage as the power source for the power consumer 125 of the satellite antenna system 120. The voltage output from the solar panel assembly 110 varies depending upon the light being received by the solar cells of the solar panels 115 of the solar panel assembly 110 the number of solar panels 115, the number of solar cells in each solar panel 115, as well as how the solar panels 115 are connected. In contrast, the voltage output from the satellite receiver 130 can be a fixed voltage. Accordingly, as discussed above, the voltage converter 146 reduces the voltage output from the satellite receiver 130. In one embodiment, for example, the voltage converter 146 reduces the voltage output from the satellite receiver 130 to 12.7 volts. However, one of ordinary skill in the art would recognize that the output of the voltage converter 146 can vary. In one embodiment, for example, the output voltage from the voltage converter 146 can be set to the lowest value allowable by the power consumer 125 taking into consideration various installation variables such as cable length, voltage tolerances, voltage and current changes over temperature, or the like, allowing maximum utilization of power from the solar panel assembly 110. In one embodiment, for example, a power consumer 125, such as a LNBF may have an allowable input voltage of 10.5-28V and a satellite receiver 130 may have an output voltage range of ~22-26V, which will drop over the coaxial cable run in addition to the voltage converter 146. Using 12.7V allows for a fairly long cable run between the satellite receiver 130 and the solar power assembly 110 while exceeding the minimum allowable input voltage for the power consumer 125. This allows the solar panel assembly 110 to power the power consumer 125 as much as possible, while providing sufficient backup power from the satellite receiver 130.

Figure 3:
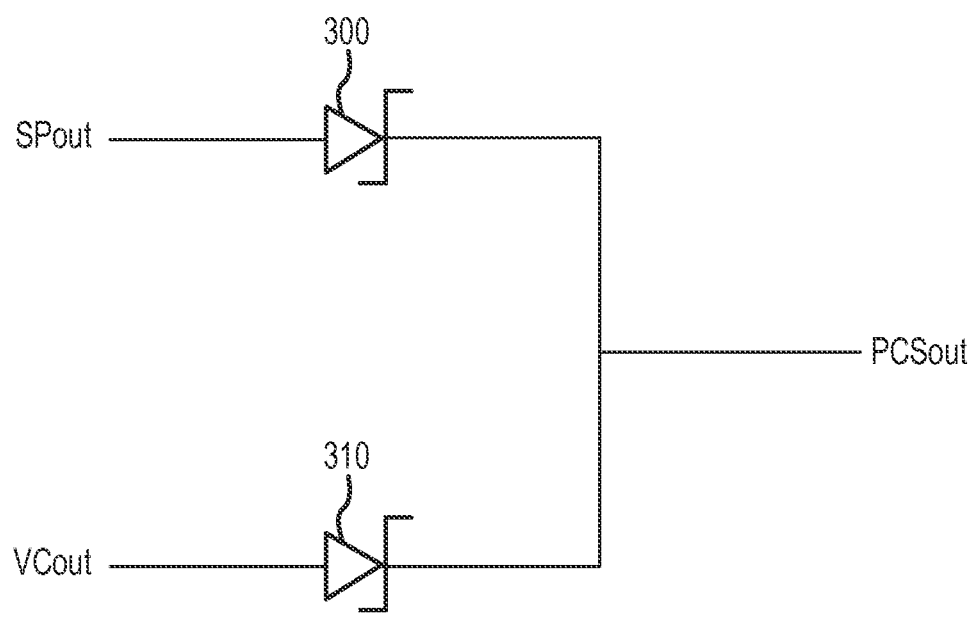
FIG. 3 illustrates an exemplary source selection circuit in accordance with an embodiment.

FIG. 3 illustrates an exemplary source selection circuit 147 in accordance with an embodiment. As seen in FIG. 3, a voltage output from the solar panel assembly 110 SPout, received through interface 142, is coupled to an anode of the diode 300. The output VCout from the voltage converter 146 is coupled to an anode of diode 310. The cathodes of diodes 300 and 310 are coupled together as well as to the output of the source selection circuit 147. The output of the source selection circuit 147 PCSout is the voltage output by the power control system 140 which is supplied to the power consumer 125 of the satellite antenna system 120. When SPout is greater than VCout, the voltage potential across diode 310 blocks the voltage from the voltage converter 146 from being connected to the output of the source selection circuit 147. Likewise, when VCout is greater than SPout, the voltage potential across diode 300 blocks the voltage from the solar panel assembly 110 from being connected to the output of the source selection circuit 148. When the VCout and SPout are substantially equal, both the solar panel assembly 110 and satellite receiver 130 provide power to the power consumer 125 of the satellite antenna system 120.

Accordingly, by appropriately selecting the voltage VCout output by the voltage converter 146, the power control system 140 can allow the solar panel assembly 110 to provide the power consumer 125 with power when the solar panel assembly 110 can provide sufficient power while allowing the satellite receiver 130 to seamlessly take over at all other times.

The output PCSout of the source selection circuit 147 is coupled to an input of the bias-T 145 along with the control and RF signals output from bias-T 144. The bias-T 145 recombines the voltage PCSout and the control and RF signals received from the satellite receiver 130 onto a single bus. The combined voltage PCSout and command signals are output to the satellite antenna system through interface 143.

In one embodiment, for example, the solar powered satellite system 100 may further include an overvoltage protection circuit 148 coupled between the interface 142 and the source selection circuit 147. While the source selection circuit 147 illustrated in FIG. 3 would not be susceptible to being damaged from a large voltage being output by the solar panel assembly 110, the power consumer 125 could be damaged during installation or during high solar exposure, depending on solar panel maximum voltage available under load. In these instances, an overvoltage protection circuit 148 could be included to reduce a voltage being received from the solar panel assembly 110. In various embodiments, for example, a shunt zener power diode circuit, a surge protection circuit or a second switched mode power supply may be used as the overvoltage protected circuit 148.

Accordingly, the power control system 140 electrically connects the power consumer 125 of the satellite antenna system 120 to the solar panel assembly 110 when voltage output by the solar panel assembly 110 is greater than the voltage output by the voltage converter 146. When the voltage output by the solar panel assembly 110 is less than the voltage output by the voltage converter 146, the power control system 140 electrically connects the satellite receiver 130 to the power consumer 125 of the satellite antenna system 120. This arrangement allows the power control system 140 to utilize solar power when the solar panel assembly 110 is outputting sufficient power, reducing the operating costs to end users, while seamlessly switching to the satellite receiver 130 when the solar panel assembly 110 is not capable of outputting sufficient power. Furthermore, because the solar powered satellite system 100 does not utilize a battery, the cost to install the solar powered satellite system 100 and the cost to maintain the solar powered satellite system 100 is minimized.

Figure 4:
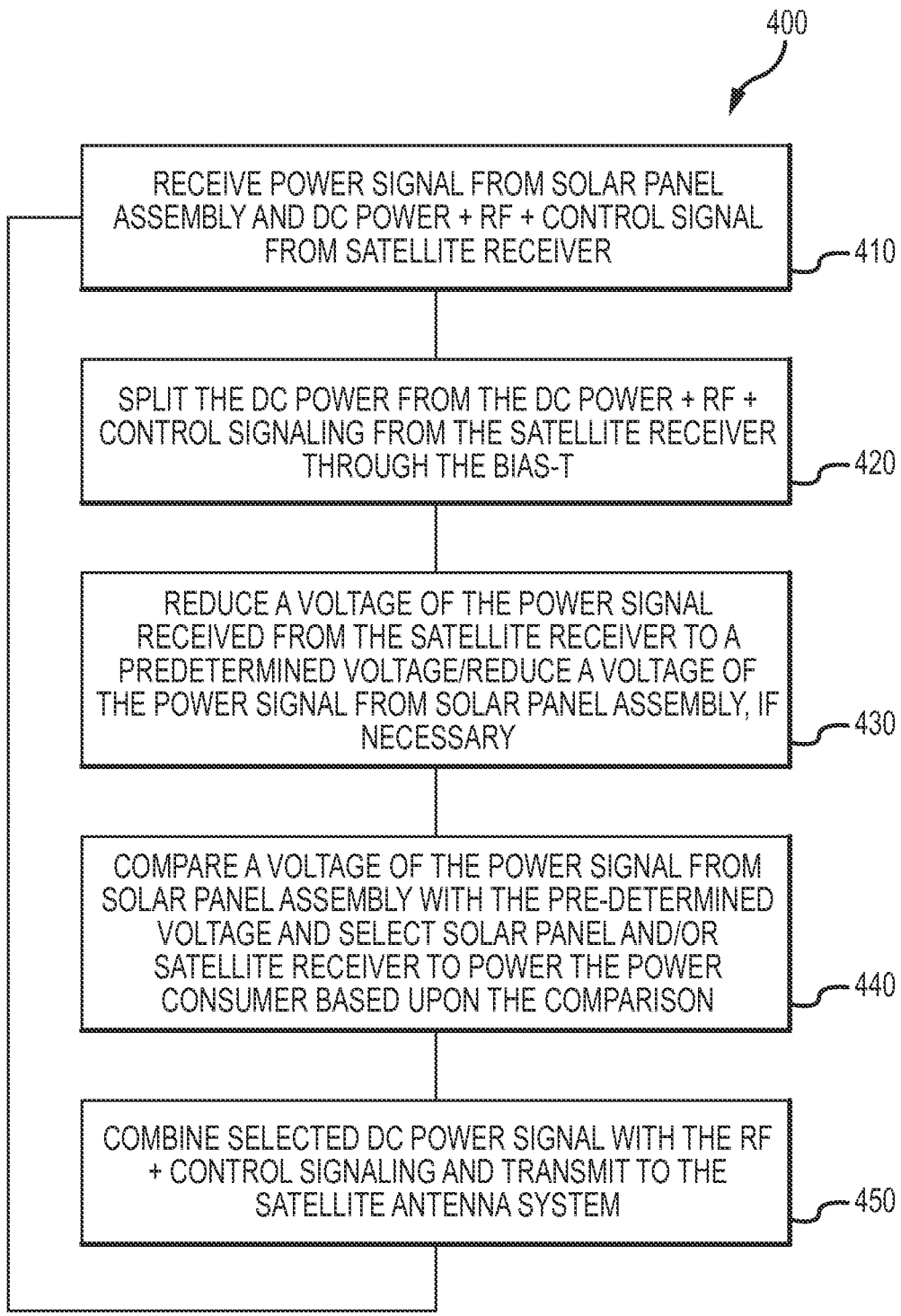
FIG. 4 is a flow diagram of a method of operating a solar powered satellite system, in accordance with an embodiment.

FIG. 4 is a flow diagram of a method 400 of operating a solar powered satellite system 100, in accordance with an embodiment. The method 400 begins when a power signal is received by the power control system 140 from the solar panel assembly 110 and a power/control/RF signal is received from the satellite receiver 130. (Step 410). As discussed above, the power from the solar panel assembly 110 and the power/control/RF signal from the satellite receiver 130 may be received via a coaxial cable interface, or the like. The power, control, and RF signals from the satellite receiver 130 are split onto two separate buses by the bias-T 144. (Step 420). The power signal is transmitted to the voltage converter 146, while the control and RF signal is transmitted to the bias-T 145.

The voltage converter 146 reduces a voltage of the power signal from the satellite receiver 130 to a predetermined voltage. (Step 430). As discussed above, the voltage converter 146 reduces the voltage of the power signal from the satellite receiver 130 to a predetermined voltage in order to simplify the controlled switching between the solar panel assembly 110 and the satellite receiver 130. In one embodiment, for example, the predetermined may be about 12.7 volts. However, the predetermined voltage could vary depending upon the power needs of the power consumer 125 of the satellite antenna system 120 and the solar panels selected. If the power needs are relatively low, the predetermined voltage could be lower to allow the solar panel assembly 110 to power the power consumer 125 more frequently. In contrast, if the power demands of the power consumer 125 of the satellite antenna system 120 are high, the predetermined voltage can be increased so that the solar panel assembly 110 is only providing power to the power consumer 125 of the satellite antenna system 120 when the solar panel assembly 110 is capable of supplying sufficient power. As discussed above, in certain embodiments an overvoltage protection circuit 148 may be used to protect the power consumer 125 and the power control system 140 from unexpectedly high voltages from the solar panel assembly 110 and during installation. In these embodiments, the overvoltage protection circuit 148 may reduce a voltage of the power signal received from the solar panel assembly 110 well within the absolute maximums allowed by electronics within the power control system 140 and the power consumer 125.

The source selection circuit 147 then compares a voltage of the power signal received from the voltage converter 146 and a voltage of the power signal received from the solar panel assembly 110 and selects the solar panel assembly 110, the satellite receiver 130, or a combination of both as the power source for the satellite antenna system 120. (Step 440). As discussed above, the selection may be made via the diode based circuit illustrated in FIG. 3, or by other comparison-type circuits. When the voltage output by the solar panel assembly 110 is greater than the voltage output by the voltage converter 146, the source selection circuit selects the solar panel assembly 110 as the source. When the voltage output by the solar panel assembly 110 is less than the voltage output by the voltage converter 146, the source selection circuit 147 selects the satellite receiver 130 as the source. When the solar panel assembly 110 and the voltage of the solar panel assembly 110 and the voltage output by the voltage converter 146 are identical, the source selection circuit may select both power sources.

The selected power source signal is then combined with the control and RF signals output by the bias-T 144 using the bias-T 145. (Step 450). Accordingly, the power control system 140 outputs the selected power signal with the control and RF signals to the satellite antenna system using a single bus. As discussed above, the single bus may be a coaxial cable bus, or the like.

Figure 5:
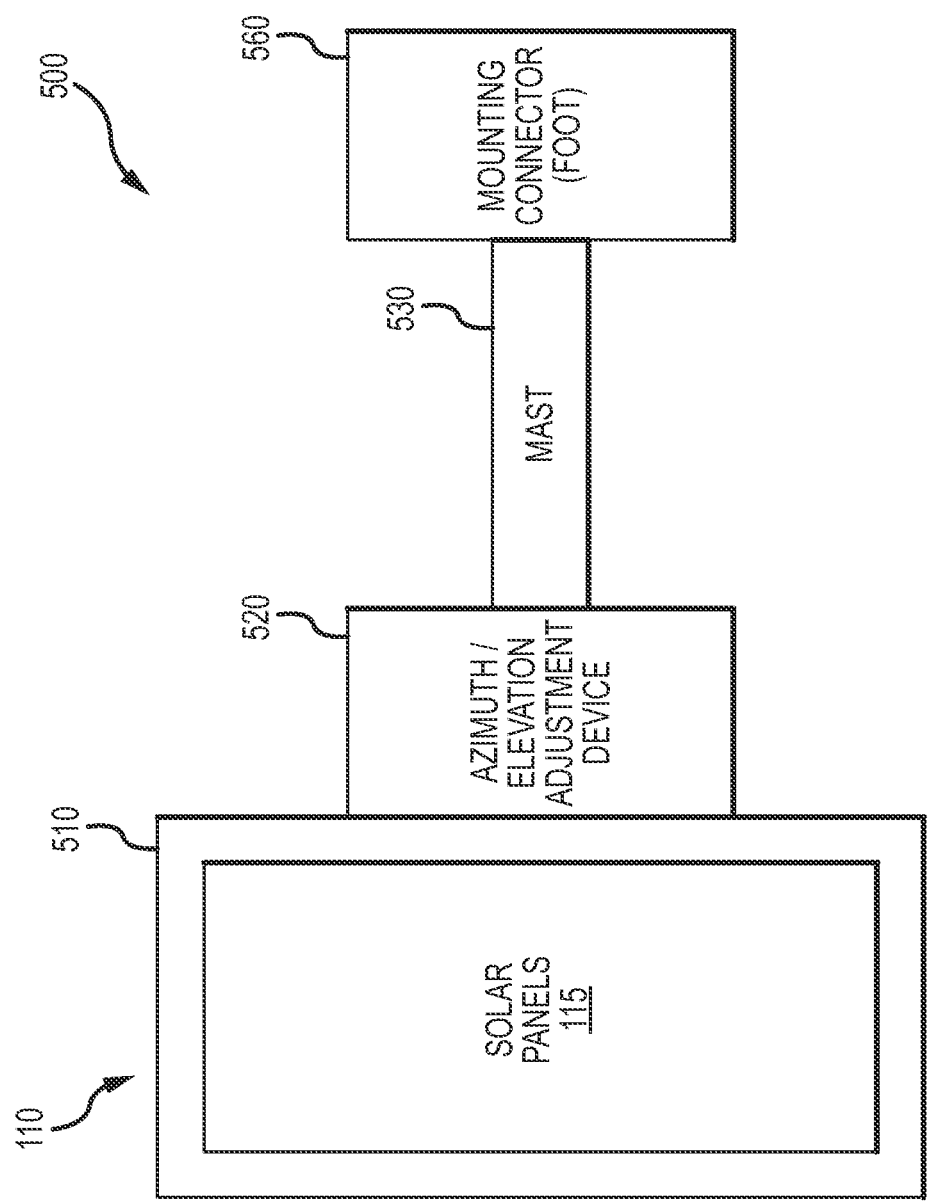
FIG. 5 is a block diagram of a solar panel installation system, in accordance with an embodiment.

In order to reduce the cost of the solar powered satellite system 100, the installation of the solar powered satellite system 100 can be simplified via a solar panel installation system. FIG. 5 is a block diagram of a solar panel installation system 500, in accordance with an embodiment. The solar panel installation system 500 includes a solar panel assembly 110. The solar panel assembly includes solar panels 115, as discussed above, mounted in a frame 510. A wide variety of frames 510 and solar panels 115 can be used, as discussed in further detail below.

The solar panel assembly 110 is coupled to an azimuth/elevation adjusting device 520. The azimuth/elevation adjusting device 520 allows the position of the solar panel(s) to be adjusted relative to an azimuth and an elevation. A mast 530 is configured to be coupled to the azimuth/elevation adjusting device 520. A mounting connector (foot) 540 is configured to be coupled to the mast 530. The mounting connector 540 is also configured to be coupled to a wall, fence or the like of a user's home or business.

Figure 6:
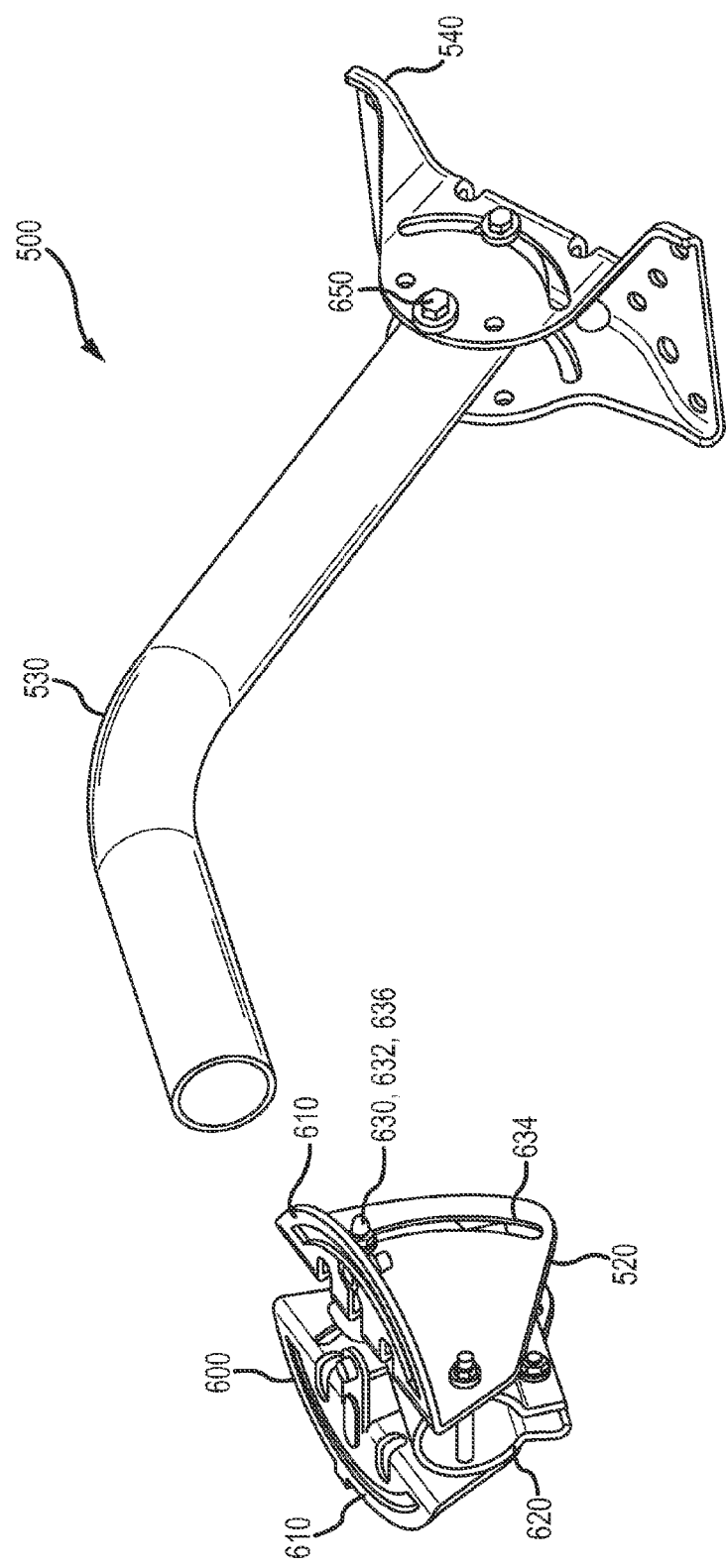
FIG. 6 is a perspective view of an exemplary azimuth/elevation adjusting device, mast and a mounting connector, in accordance with an embodiment.
Figure 7:
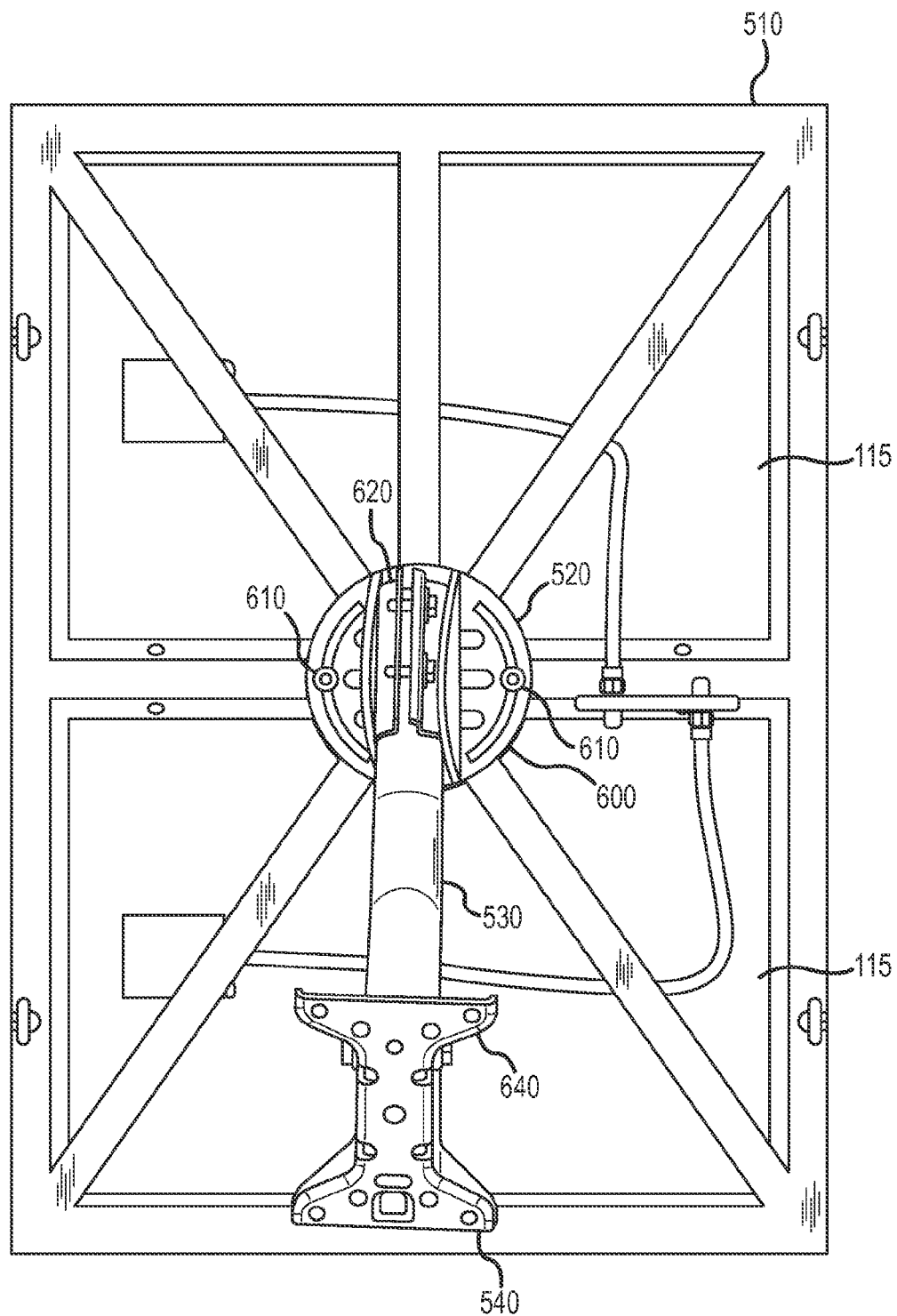
FIG. 7 is a rear view of the exemplary azimuth/elevation adjusting device, mast and mounting connector, in accordance with an embodiment.

FIGS. 6-7 illustrate exemplary examples of a solar panel installation system 500, in accordance with an embodiment. FIG. 6 is a perspective view of an exemplary azimuth/elevation adjusting device 520, mast 530 and a mounting connector 540, in accordance with an embodiment. FIG. 7 is a rear view of the exemplary azimuth/elevation adjusting device 520, mast 530 and mounting connector 540. In the embodiment illustrated in FIG. 7, azimuth/elevation adjusting device 520 is coupled to an exemplary solar panel assembly 110.

The azimuth/elevation adjusting device 520 illustrated in FIGS. 6-7 includes a solar panel coupling interface 600 for coupling the azimuth/elevation adjusting device 520 to the solar panel assembly 110. In the embodiment illustrated in FIGS. 6-7, the solar panel coupling interface 600 is a circular plate having several connection points 610. In the embodiment illustrated in FIGS. 6-7 the connection points 610 are semi-circular channels through which screws, bolts or other connecting mechanisms can be used to secure the coupling interface 600 to the solar panel assembly 110. However, in other embodiments the connection points 610 may be slots, holes or any other arrangement through which a fastener such as a screw or a bolt may be used to secure the coupling interface 600 to the solar panel assembly 110. In yet another embodiment, for example, the connection points 610 may be clips, clamps, rivets, adhesive, or any other mechanism through which the solar panel coupling interface 600 could be secured to the solar panel assembly 110.

The azimuth/elevation adjusting device 520 further includes a mast mount interface 620. As the name suggests, the mast mount interface 620 couples the mast 530 to the azimuth/elevation adjusting device 520. In one embodiment, for example, the mast mount interface 620 may include one or more securable clamps, as seen in FIG. 7. In this embodiment, for example, the securable clamp(s) may be tightened around the mast via one or more screws, bolts, nuts, washers and the like. An azimuth (i.e., a side to side adjustment) of the solar panel assembly 110 can be adjusted by selecting and angle between the azimuth/elevation adjusting device 520 and the mounting connector 540 via the mast mount interface 620.

As best seen in FIG. 6, the azimuth/elevation adjusting device 520 further includes a securable pivot 630. The securable pivot 630 includes an axis 632, a channel 634, and securing device(s) 636. The securing device(s) 636 can include one or more screws, bolts, nuts, washers, or the like. By loosening the securing device(s) 636 and moving the axis 632 within the channel 634, a user can adjust an angle between the mast 530 and the solar panel assembly 110, thereby adjusting the elevation of the solar panel assembly 110.

The mounting connector 540 includes a mounting interface 640 for coupling the mounting connector 540 to a surface, such as a wall or fence of a home or business. In the embodiment illustrated in FIGS. 6-7, the mounting connector 540 includes multiple holes through which screws, bolts or other connecting mechanisms can be used to secure the mounting connector 540 to a surface. However, in other embodiments the mounting interface 640 may be slots, channels or any other arrangement through which a fastener such as a screw or a bolt may be used to secure the coupling interface 600 to the solar panel assembly 110.

The mounting connector 540 further includes mast mount interface 650 couples the mast 530 to the mounting connector 540. In the embodiment illustrated in FIGS. 6-7, the mast mount interface 650 includes a bolt for coupling the mast 530 to the mounting connector 540. However, the mast mount interface 650 could include one or more securable clamps, screws, bolts, nuts, washers, and the like, or any combination thereof.

The mast 530 illustrated in FIGS. 6-7 has a substantially circular cross-section. However, in other embodiments the mast 530 may have, for example, an oval cross-section, a triangular cross-section, a rectangular cross-section, a pentagonal cross-section, or the like. In one embodiment, for example, cables for connecting the solar panels 115 to the power control system 140 can be run through the center of the mast 530. As best seen in FIG. 6, the mast 530 includes a bend. In the embodiment illustrated in FIG. 6, the bend is approximately 45 degrees. However, the bend can vary depending upon the needs of the assembly. The bend provides an offset for the solar panels 115, from the structure to which the system is mounted. The elevation can be further modified by the azimuth/elevation adjustment interface (520), as discussed above.

The solar panel assembly 110 illustrated in FIG. 7 includes two solar panels 115. The solar panel assembly 110 includes a frame 510 for securing the solar panels 115. The solar panels 115 may be secured to the frame 510 via screws, bolts, nuts, glue, epoxy, or the like, or any combination thereof.

Figure 8:
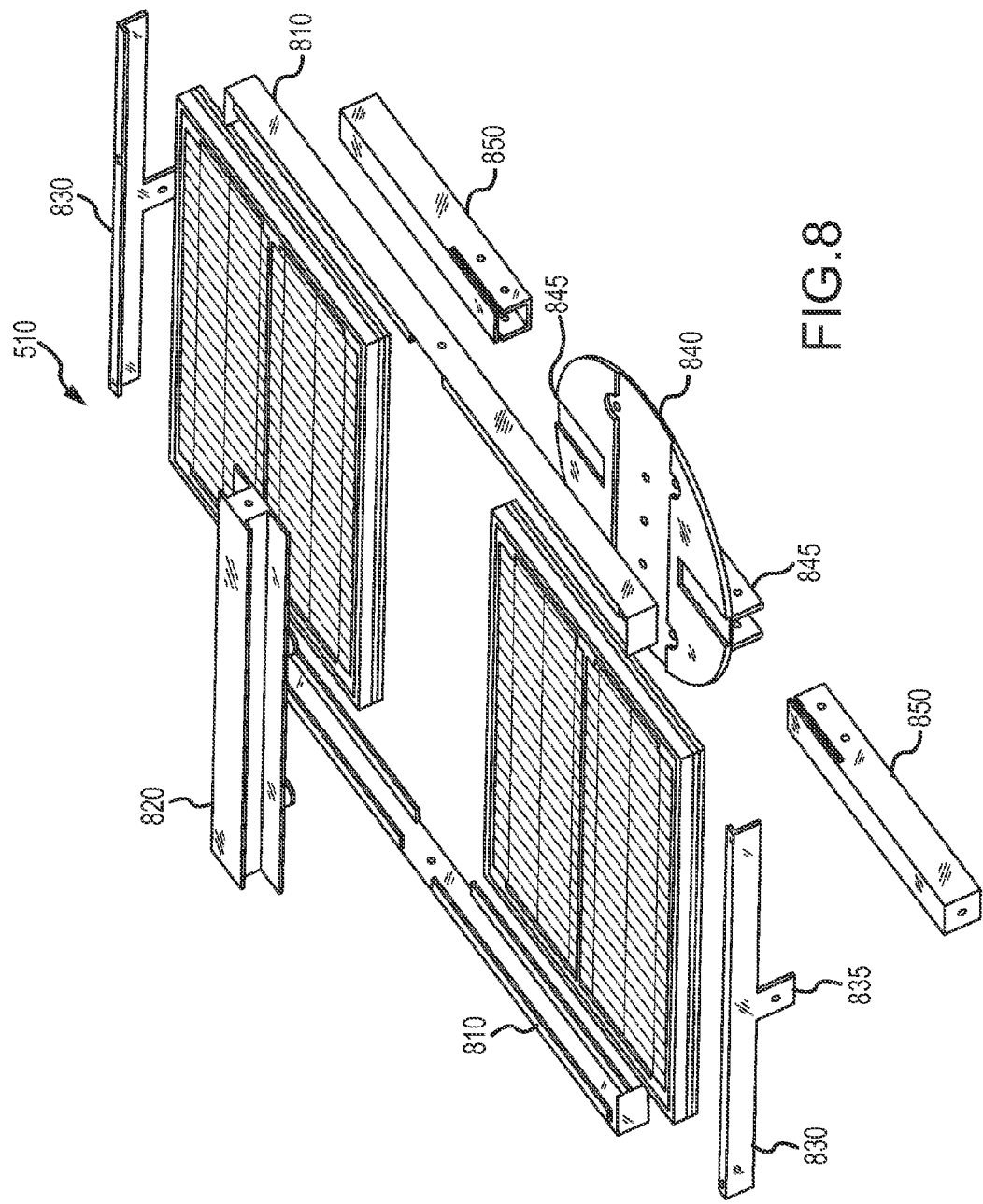

FIGS. 8-9 are perspective views of another frame 510, in accordance with an embodiment. The frame 510 is a modular frame which allows a user to install solar panels 115 of different sizes, or adjust a number of solar panels used in the solar panel assembly 110. Different locations across the globe may have differences in average solar exposure. A solar panel assembly 110 installed in a home in Arizona, for example, would have a much higher expected average solar exposure than a solar panel assembly installed in, for example, Illinois. Accordingly, in order to provide a similar amount of power in various locations, a single modular frame, such as the frame 510 illustrated in FIG. 8, which allows for different sizes and number of solar panels to be installed is advantageous.

The frame 510 includes two vertical braces 810. Each vertical brace 810 includes a channel on an inner side. The solar panels 115 can be constructed, or retrofit, with a corresponding frame to fit securely with within the channels of the vertical braces. In other words, the width of the channels of the vertical braces may be a first predetermined width and the width of the solar panels 115 may be a second predetermined width, slightly smaller than the first predetermined width such that solar panels 115 securely slide into the frame 510.

A central brace 820 can be secured in the center of the vertical braces 810. The central brace 820 could be secured, for example, via a screw, bolt or the like. The central brace 820 includes a channel on each side, allowing the solar panels 115 to be supported on three sides within the channels of the vertical braces 810 and the central brace 820. The channels on each side of the central brace may be of the same width as the channels on the vertical braces 810. The frame 510 further includes two end braces 830. The end braces 830 secure the upper and lower ends of the frame 510, holding the solar panels in place. As discussed in further detail below, the end braces 830 have a lower protrusion 835 allow for different sized solar panels to be placed into the frame 510.

The frame 510 further includes a back plate 840 and two back supports 850. The azimuth/elevation adjusting device 520 can be secured to the frame back plate 840 via screws, bolts, or in any other fashion. The central brace 820 can also be secured to the back plate 840 via screws, bolts or the like to provide added strength and rigidity to the frame 510. The back plate 840 includes two channels 845 through which the back supports 850 can be secured to. As seen in FIG. 8, the channels 845 include holes through which screws, bolts or the like can be used to secure the back supports 850. The lower protrusion 835 of the end braces 830 can be coupled to the back supports to complete the frame 510.

As seen in FIG. 9, a length of the back plate 840 and back supports is less than the length of the vertical braces 810, leaving the gap between the lower protrusion 835 of the end braces and the back supports. The size of the gap will depend upon the length of the braces 810. The length of the braces 810 are selected to correspond to the size of the solar panels 115.

Figure 11:
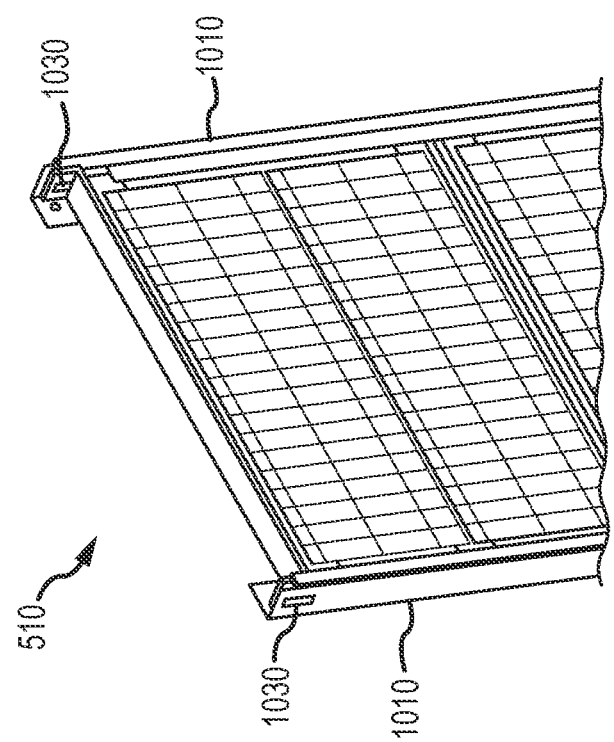
FIGS. 10-11 are perspective views of another exemplary frame, in accordance with an embodiment.
Figure 10:
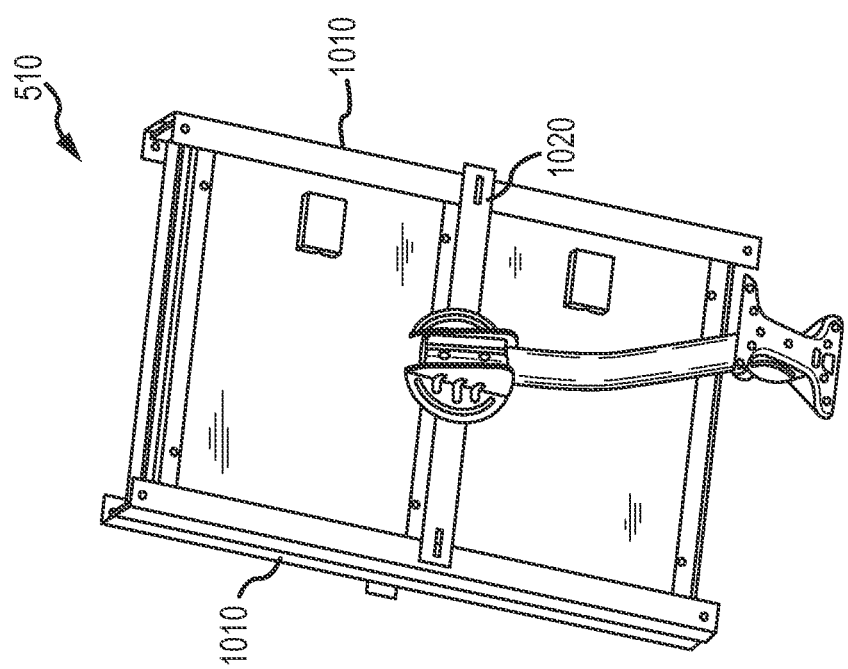

FIGS. 10-11 are perspective views of another exemplary frame 510, in accordance with an embodiment. The frame 510 includes two vertical braces 1010 and a central brace 1020. As seen in FIG. 10, the azimuth/elevation adjusting device 520 can be secured to the central brace 1020 in any manner. The vertical braces 1010 include a channel for securing solar panels 115 in a similar manner as the vertical braces 810. However, in this embodiment, the channels do not extend the entire length of the vertical braces 1010. As best seen in FIG. 11, the channels end a predetermined length before the end of each vertical brace 1010. The vertical braces 1010 further include a securing channel 1030 towards each end of the vertical braces 1010 around the end of the channels. The securing channel 1030 can be used to secure end braces 1040 between each vertical brace 1010. As best seen in FIG. 11, the securing channels 1030 are holes that extend a length of the vertical braces 1010. The securing channels 1030 therefore allow different sized solar panels 115 to be easily secured within the same frame 510. While not illustrated, this configuration allows the solar panels 115 to extend beyond the bounds of the frame 510 while remaining secure. Accordingly, in installation locations with lower sunlight expectancy, larger solar panels 115 can be fit in the frame 510 to compensate for the lower sunlight expectancy.

Figure 12:
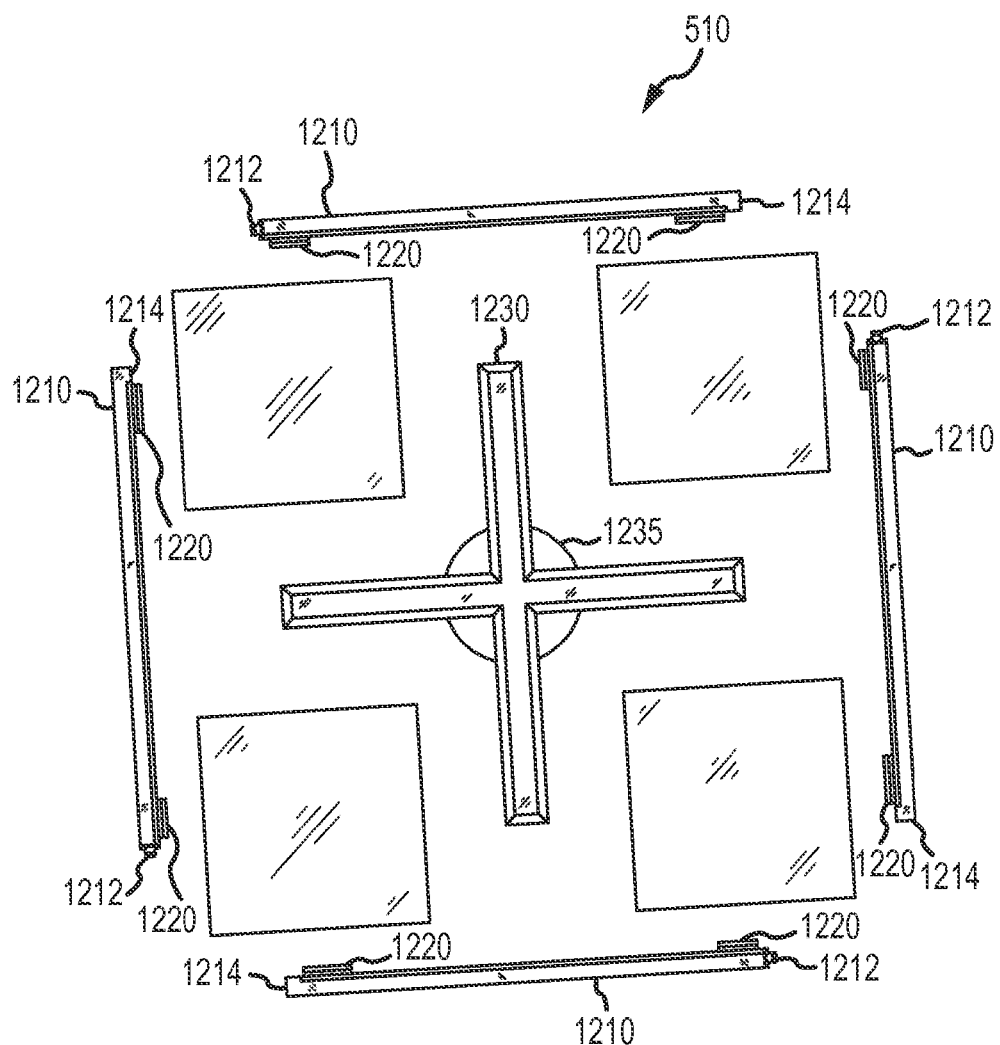
FIGS. 12-14 are views of another exemplary frame, in accordance with an embodiment.
Figure 14:
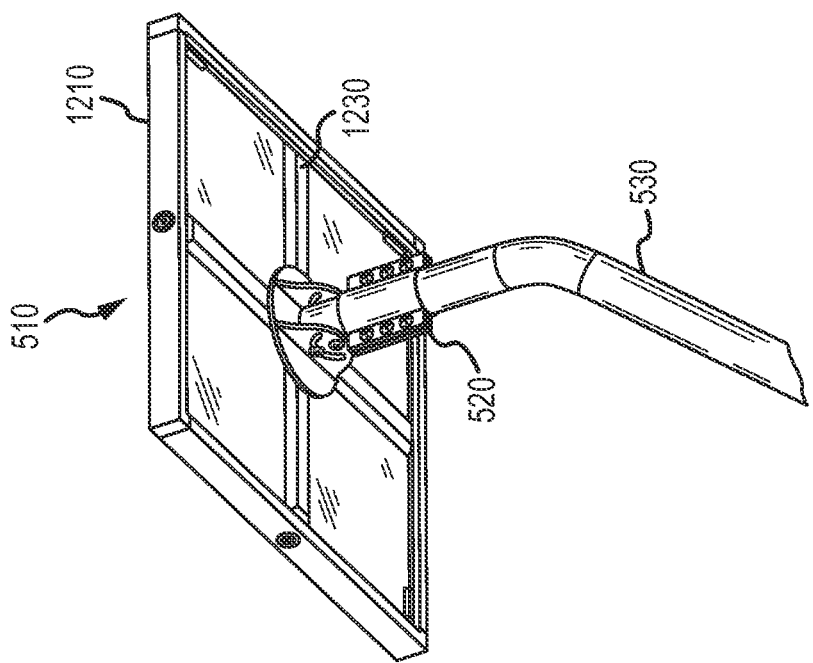
Figure 13:
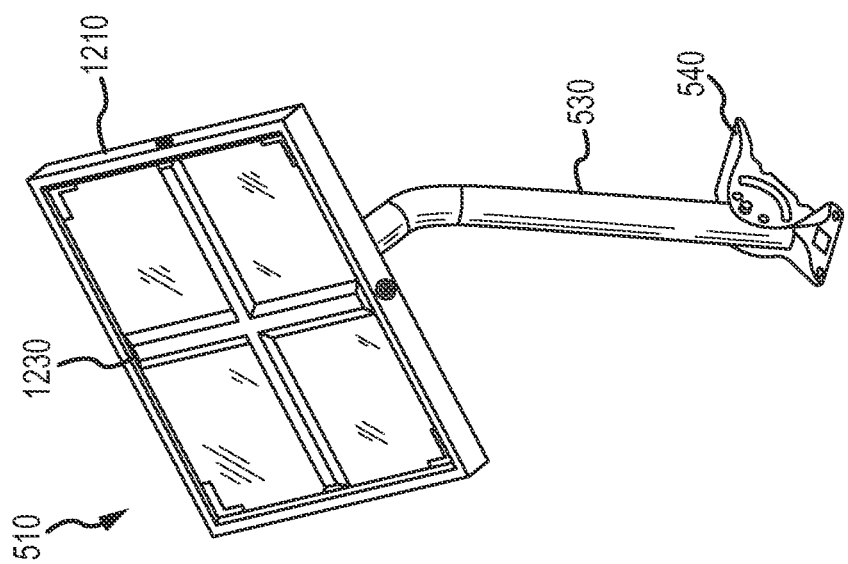

FIGS. 12-14 are views of another exemplary frame 510, in accordance with an embodiment. The frame 510 includes four exterior braces 1210. Each exterior brace 1210 includes a quick connect interface 1220 for electrically connecting the solar panels 115. Each exterior brace 1210 includes a male connector 1212 and a female connector 1214, best seen in a similar embodiment illustrated in FIG. 15. The male connector 1212 on an exterior brace 1210 connects with a female connector 1214 of an adjacent exterior brace 1210 to form the outer portion of the frame 510.

Each quick connect interface 1220 can be used to both secure a solar panel 115 to the frame 510 as well as electrically connect the solar panels 115. As discussed above, the expected power output by a solar panel 115 will vary depending upon the location of the installation. The frame 510 having the quick connect interfaces 1220 allows a user installing the device to optimally select the number of solar panels 115 for the installation location. As the solar panels 115 are one of the largest, if not the largest, cost of the solar panel assembly 110, allowing for a customizable number of solar panels 115 to be used at every installation location allows the cost of the solar panels 115 in each respective installation to be minimized. This frame configuration allows, 1, 2, 3 or 4 solar panels 115 to be placed within the frame such that the minimal number of solar panels required for a installation location can be installed in the frame.

The frame 510 further includes a central brace 1230. The central brace 1230 is substantially plus (i.e., "+") shaped. While the solar panels 115 illustrated in FIGS. 12-14 are substantially square, one of ordinary skill in the art would recognize that the dimensions of the solar panels 115 could vary and that the respective lengths of the arms of the central brace 1230 and the exterior braces 1210 can vary accordingly. As seen in FIGS. 13-14, each exterior brace 1210 can be coupled to the central brace 1230 via a screw, bolt, or the like. Further, as seen in FIG. 14, the azimuth/elevation adjusting device 520 can be secured to a rear side of the central brace 1230. The central brace further includes a platform 1235 for coupling to the azimuth/elevation adjusting device 520. The platform 1235 illustrated in FIG. 12 is substantially circular corresponding to the substantially circular solar panel interface 600 of the azimuth/elevation adjusting device 520 illustrated in FIG. 6. However, one of ordinary skill in the art would recognize that the shape of both the platform 1235 and the solar panel interface 620 of the azimuth/elevation adjusting device 520 can vary.

Figure 15:
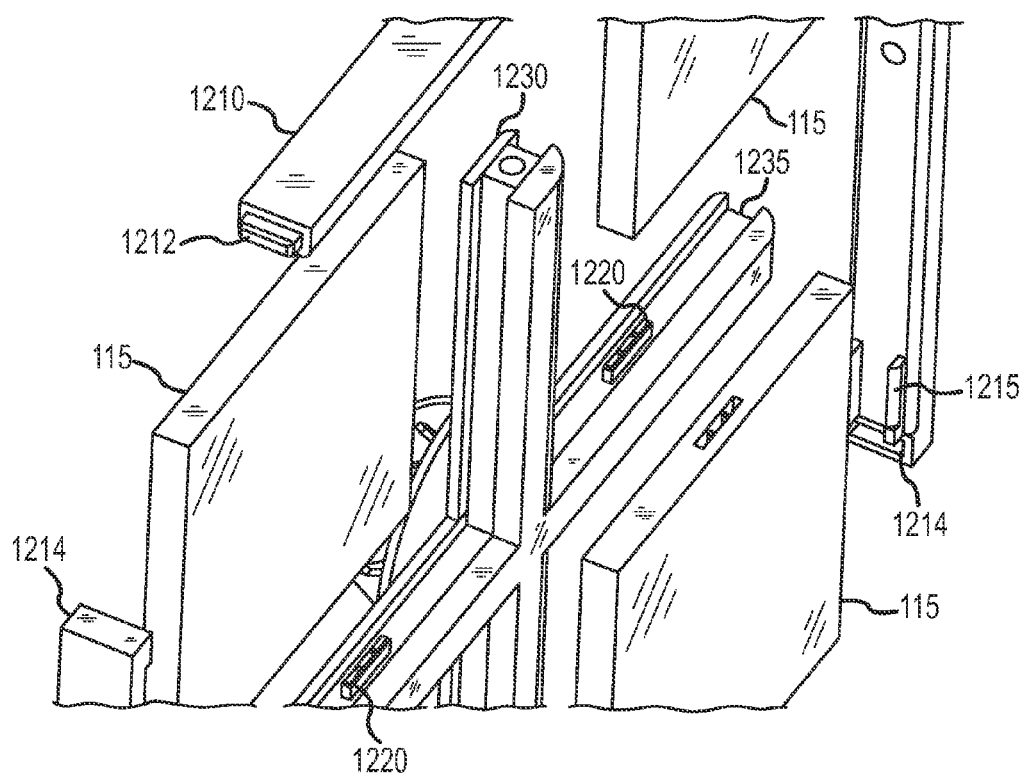
FIG. 15 illustrates yet another frame, in accordance with an embodiment.

FIG. 15 illustrates yet another frame 510, in accordance with an embodiment. The frame 510 illustrated in FIG. 15 is similar to the frame illustrated in FIGS. 12-14. However, the quick connect interfaces 1220 in this embodiment are located on the central brace 1230, allowing for parallel electrical connections. However, one of ordinary skill in the art would understand that both the central brace 1230 and one or more of the four exterior braces 1210 could include the quick connect interfaces 1220 in other embodiments.

As illustrated in FIG. 15, the central brace 1230 can include a channel 1235 having a predetermined width. As discussed above, the predetermined width can be selected such that the solar panels 115 securely fit within the channels 1235. The four exterior braces 1210 can also include channels 1215, as illustrated in FIG. 15. While the channels 1215 illustrated in FIG. 15 are only at the ends of the respective exterior braces 1210, one of ordinary skill in the art would recognize that the channels could extend any length of the respective exterior braces 1210.

Figure 16:
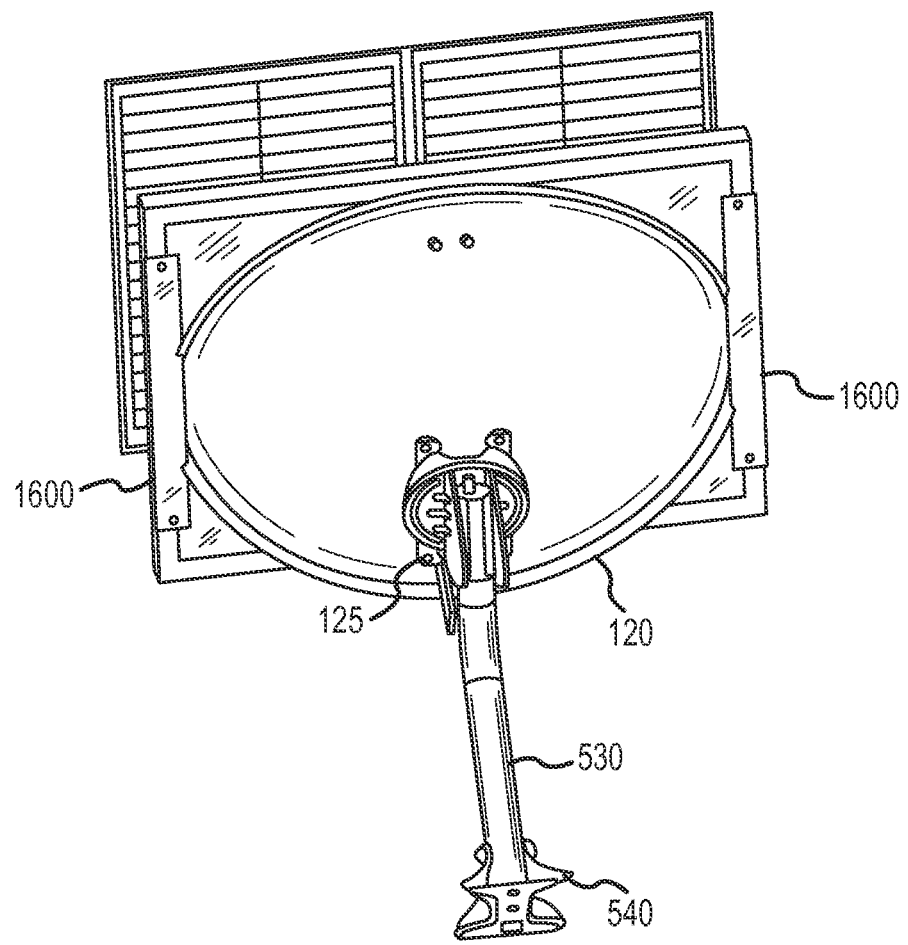
FIG. 16 illustrates yet another frame, in accordance with an embodiment.

FIG. 16 illustrates yet another frame 510, in accordance with an embodiment. If a user's home or business has an existing, but unused, satellite dish already installed, the frame 510 illustrated in FIG. 16 allows for the solar panels to be retrofit onto the existing satellite dish installation. In this embodiment, the frame 510 is secured directly to a satellite dish via two securing devices 1600. This embodiment reduces the cost and number of new parts needed to mount the solar panel assembly 110 at the user's location.

Figure 17:
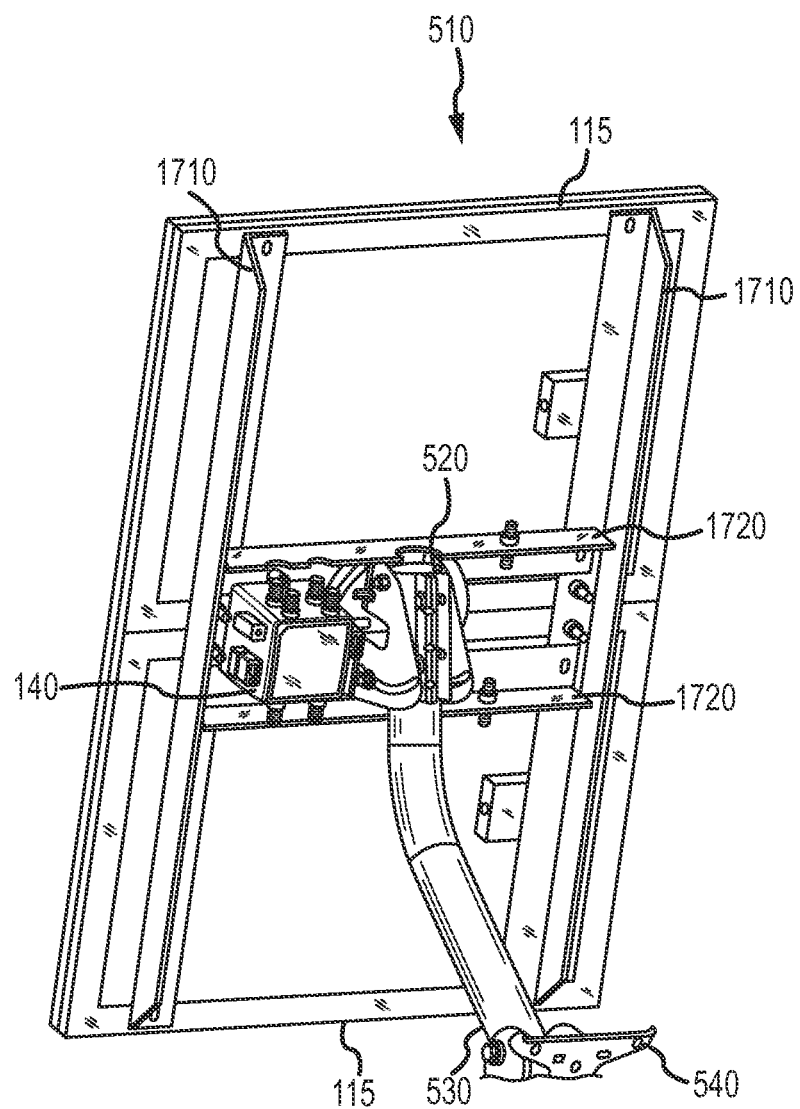
FIGS. 17-18 illustrate yet another frame, in accordance with an embodiment.
Figure 18:
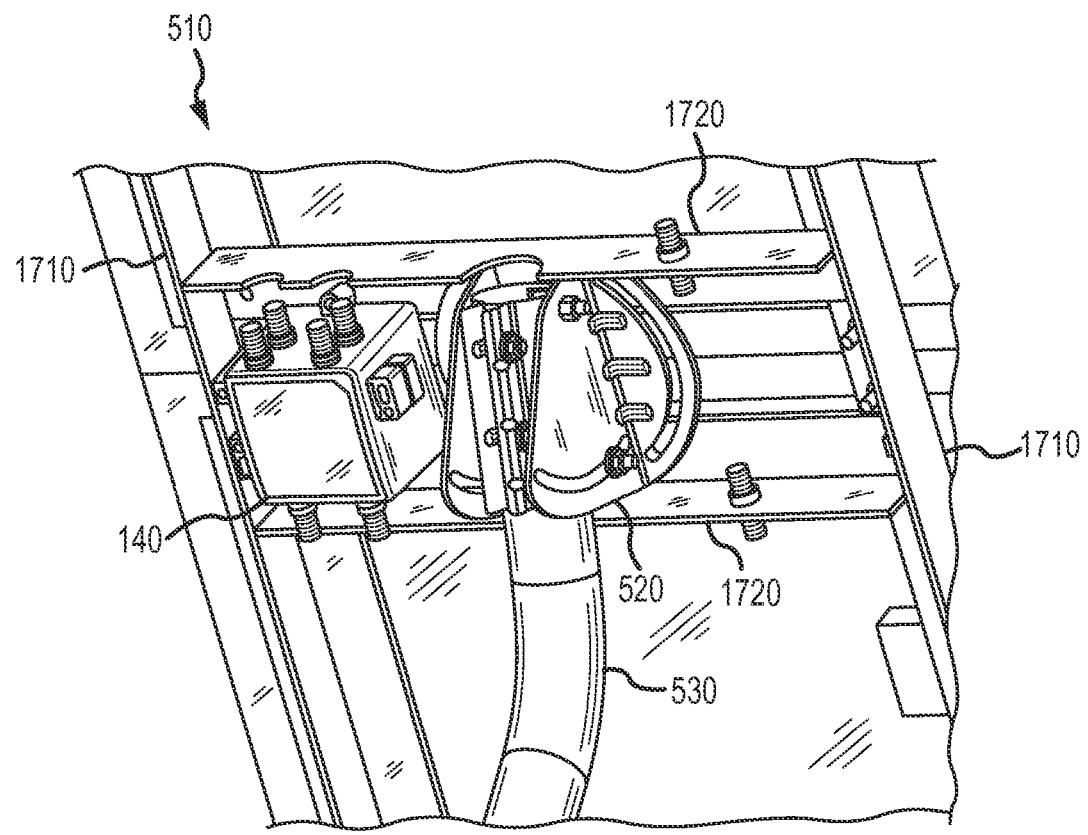

FIGS. 17-18 illustrate yet another frame 510, in accordance with an embodiment. The frame 510 includes two vertical braces 1710 and two horizontal braces 1720. The vertical braces 1710 are secured to the solar panels 115 via screws, bolts or the like. The horizontal braces 1720 are coupled to the verticals braces via screws, bolts or the like. The azimuth/elevation adjusting device 520 can then be coupled to the horizontal braces 1710 to complete the frame 510.

In this embodiment, the power control system 140 and/or a power consumer 125 may be coupled to the horizontal braces 1710. This minimizes the cable length needed to coupled the devices together. As best seen in FIG. 18, the horizontal braces 1720 include cutouts for the cables of the power control system 140 and/or a power consumer 125 as well as cutouts for the mast 530. The cutouts allow for easy installation of the coupling cables and the mast 530 to the frame 510.

The term "exemplary" is used herein to represent one example, instance or illustration that may have any number of alternates. Any implementation described herein as "exemplary" should not necessarily be construed as preferred or advantageous over other implementations.

Although several exemplary embodiments have been presented in the foregoing description, it should be appreciated that a vast number of alternate but equivalent variations exist, and the examples presented herein are not intended to limit the scope, applicability, or configuration of the invention in any way. To the contrary, various changes may be made in the function and arrangement of the various features described herein without departing from the scope of the claims and their legal equivalents.

What is claimed is:

1. A solar panel installation system, comprising:
    a frame configured to secure at least one solar panel;
    an azimuth/elevation adjusting device coupled to the frame for adjusting an azimuth and elevation of the frame, the azimuth/elevation adjusting device comprising:
        a solar panel interface, the solar panel interface securably connecting the azimuth/elevation adjusting device to the frame;
        a mast mount interface, the mast mount interface securably connecting the azimuth/elevation adjusting device to the mast; and
        a securable pivot for adjusting the elevation of the frame, the securable pivot comprising:
            a first projection extending substantially perpendicular from the solar panel interface;
            a second projection extending substantially perpendicular from the solar panel interface, the first projection and the second projection defining an arc shaped channel;
            an axis configured to be movable within the arc shaped channel; and
            at least one securing device to lock the axis into a position within the arc shaped channel to set the elevation of the frame, the at least one securing device selected from the group consisting of a screw, a bolt and a nut;
    a mast securably connected to the azimuth/elevation adjusting device; and
    a mounting connector securably connected to the mast, the mounting connector configured to be connected to an installation location.

2. The solar panel installation system of claim 1, wherein the mounting connector comprises:
    a mounting interface for securing the solar panel installation system to a location;

a mast mount interface, the mast mount interface configured to securably connect the mounting interface to the mast; and an elevation adjustment device, the elevation adjustment device comprising:
a channel;
an axis configured to be movable within the channel; and
at least one securing device to lock the axis into a position within the channel to set the elevation of the frame.

3. The solar panel installation system of claim 1, wherein the frame comprises at least one quick connect interface for electrically coupling two or more solar panels together.

4. The solar panel installation system of claim 1, wherein the frame comprises:
two vertical braces, each vertical brace having a channel of a predetermined width;
a central brace coupled between the two vertical braces, the central brace having a channel of a predetermined length on each side of the central brace;
two end braces, each end brace having a lower protrusion;
a back plate coupled to the central brace, the back plate configured to be coupled to the azimuth/elevation adjusting device, the back plate comprising two channels;
and two back supports, each back support securably connected into one of the two channels of the back plate, each back support configured to be securably connected to a lower protrusion of one of the two end braces.

5. The solar panel installation system of claim 4, wherein a combined length of the two back supports and the back plate is less than a length of one of the two vertical braces.

6. The solar panel installation system of claim 1, wherein the frame comprises:
two vertical braces, each vertical brace having a channel of a predetermined width configured to receive at least one of the solar panels, each vertical brace further comprising a securing channel at each end of the vertical brace;
a central brace coupled between the two vertical braces, the central brace configured to be coupled to the azimuth/elevation adjusting device; and
two end braces, each end brace securable connected to the two vertical braces via the securing channels.

7. The solar panel installation system of claim 6, wherein the end braces are securably connected to the two vertical braces via screws secured through the securing channels.

8. The solar panel installation system of claim 1, wherein the frame comprises:
a substantially plus shaped central brace, the substantially plus shaped central brace further comprising a platform configured to be coupled to the azimuth/elevation adjusting device;
a plurality of exterior braces, each exterior brace comprising a male-style connector and a female-style connector, wherein the plurality of exterior braces are connected via the male-style connectors and a female-style connectors, and each exterior brace is securably connected to an arm of the substantially plus shaped central brace.

9. The solar panel installation system of claim 8, wherein the substantially plus shaped central brace further comprises at least one electrical quick connector for electrically coupling to a solar panel.

10. The solar panel installation system of claim 8, wherein each of the plurality of exterior braces comprises at least one electrical quick connector for electrically coupling to a solar panel.

11. The solar panel installation system of claim 8, wherein each arm of the substantially plus shaped central brace further comprises a channel configured to receive a solar panel.

12. The solar panel installation system of claim 8, wherein the frame can selectably receive between one and four solar panels.

13. The solar panel installation system of claim 1, wherein the frame is configured to mount to solar panels of at least two different sizes.

14. The solar panel installation system of claim 1, wherein the solar panel is electrically connected to a power consumer of a satellite dish.

15. The solar panel installation system of claim 1, wherein the frame comprises:
two vertical braces secured to the at least one solar panel;
two horizontal braces secured to the two vertical braces, wherein the azimuth/elevation adjusting device and a power control system for controlling the distribution of power from the at least one solar panel are coupled to the two horizontal braces.

16. A solar panel installation system, comprising:
a frame configured to secure at least one solar panel;
an azimuth/elevation adjusting device coupled to the frame for adjusting an azimuth and elevation of the frame, the azimuth/elevation adjusting device comprising:
a solar panel interface, the solar panel interface securably connecting the azimuth/elevation adjusting device to the frame;
a mast mount interface, the mast mount interface securably connecting the azimuth/elevation adjusting device to the mast; and
a securable pivot for adjusting the azimuth and elevation of the frame, the securable pivot comprising:
a first projection extending substantially perpendicular from the solar panel interface;
a second projection extending substantially perpendicular from the solar panel interface, the first projection and the second projection defining an arc shaped channel;
an axis configured to be movable within the arc shaped channel; and
at least one securing device to lock the axis into a position within the arc shaped channel to set the elevation of the frame, the at least one securing device selected from the group consisting of a screw, a bolt and a nut; and
a mast securably connected to the azimuth/elevation adjusting device.

17. The solar panel installation system of claim 16, wherein the at least one solar panel is electrically connected to a power consumer of a satellite dish.

18. The solar panel installation system of claim 16, wherein the frame is configured to mount to solar panels of at least two different sizes.

19. An apparatus, comprising:
a solar panel;
a frame receiving the solar panel; and
an azimuth/elevation adjusting device coupled to the frame for adjusting an azimuth and elevation of the frame, the azimuth/elevation adjusting device comprising:
- a solar panel interface, the solar panel interface securably connecting the azimuth/elevation adjusting device to the frame;
- a mast mount interface, the mast mount interface securably connecting the azimuth/elevation adjusting device to the mast; and
- a securable pivot for adjusting the azimuth and elevation of the frame, the securable pivot comprising:
  - a first projection extending substantially perpendicular from the solar panel interface;
  - a second projection extending substantially perpendicular from the solar panel interface, the first projection and the second projection defining an arc shaped channel;
  - an axis configured to be movable within the arc shaped channel; and
  - at least one securing device to lock the axis into a position within the arc shaped channel to set the elevation of the frame, the at least one securing device selected from the group consisting of a screw, a bolt and a nut; and
- a mast mechanically coupled to the azimuth/elevation adjusting device; and
- a satellite dish electrically connected to the solar panel.

* * * * *